United States Patent
Yang et al.

(10) Patent No.: US 11,977,335 B2
(45) Date of Patent: May 7, 2024

(54) PATTERN DECOMPOSITION METHOD

(71) Applicant: United Microelectronics Corp., Hsinchu (TW)

(72) Inventors: Min Cheng Yang, Tainan (TW); Wei Cyuan Lo, Taichung (TW); Yung-Feng Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 303 days.

(21) Appl. No.: 17/353,582

(22) Filed: Jun. 21, 2021

(65) Prior Publication Data
US 2022/0382169 A1    Dec. 1, 2022

(30) Foreign Application Priority Data

May 31, 2021    (CN) .......................... 202110600284.8

(51) Int. Cl.
*G03F 7/00*    (2006.01)
*G03F 1/36*    (2012.01)
*G03F 1/70*    (2012.01)

(52) U.S. Cl.
CPC ............ *G03F 7/70466* (2013.01); *G03F 1/36* (2013.01); *G03F 1/70* (2013.01); *G03F 7/70475* (2013.01)

(58) Field of Classification Search
CPC .......... G03F 7/70466; G03F 1/36; G03F 1/70; G03F 7/70441; G03F 7/70475
See application file for complete search history.

(56) References Cited

U.S. PATENT DOCUMENTS

| | | | | |
|---|---|---|---|---|
| 4,591,540 A | * | 5/1986 | Bohlen | ...................... G03F 1/68 430/311 |
| 6,225,013 B1 | * | 5/2001 | Cohen | ................. G03F 7/70475 430/30 |
| 7,794,920 B2 | | 9/2010 | Choi | |
| 7,802,226 B2 | | 9/2010 | Park et al. | |
| 7,913,197 B1 | * | 3/2011 | Kruger | ................ G03F 7/70475 700/121 |
| 8,612,902 B1 | * | 12/2013 | Agarwal | ............... H01L 21/027 716/54 |
| 2013/0153534 A1 | * | 6/2013 | Resnick | ............. B29D 11/0074 216/24 |
| 2014/0145342 A1 | * | 5/2014 | Schultz | ................. G03F 7/0035 257/773 |
| 2020/0097631 A1 | * | 3/2020 | Huang | ................ H01L 21/0274 |

\* cited by examiner

*Primary Examiner* — Mark F. Huff
*Assistant Examiner* — Moriah S. Smoot
(74) *Attorney, Agent, or Firm* — J.C. PATENTS

(57) ABSTRACT

A pattern decomposition method including following steps is provided. A target pattern is provided, wherein the target pattern includes first patterns and second patterns alternately arranged, and the width of the second pattern is greater than the width of the first pattern. Each of the second patterns is decomposed into a third pattern and a fourth pattern, wherein the third pattern and the fourth pattern have an overlapping portion, and a pattern formed by overlapping the third pattern and the fourth pattern is the same as the second pattern. The third patterns and the first pattern adjacent to the fourth pattern are designated as first photomask patterns of a first photomask. The fourth patterns and the first pattern adjacent to the third pattern are designated as second photomask patterns of a second photomask.

7 Claims, 6 Drawing Sheets

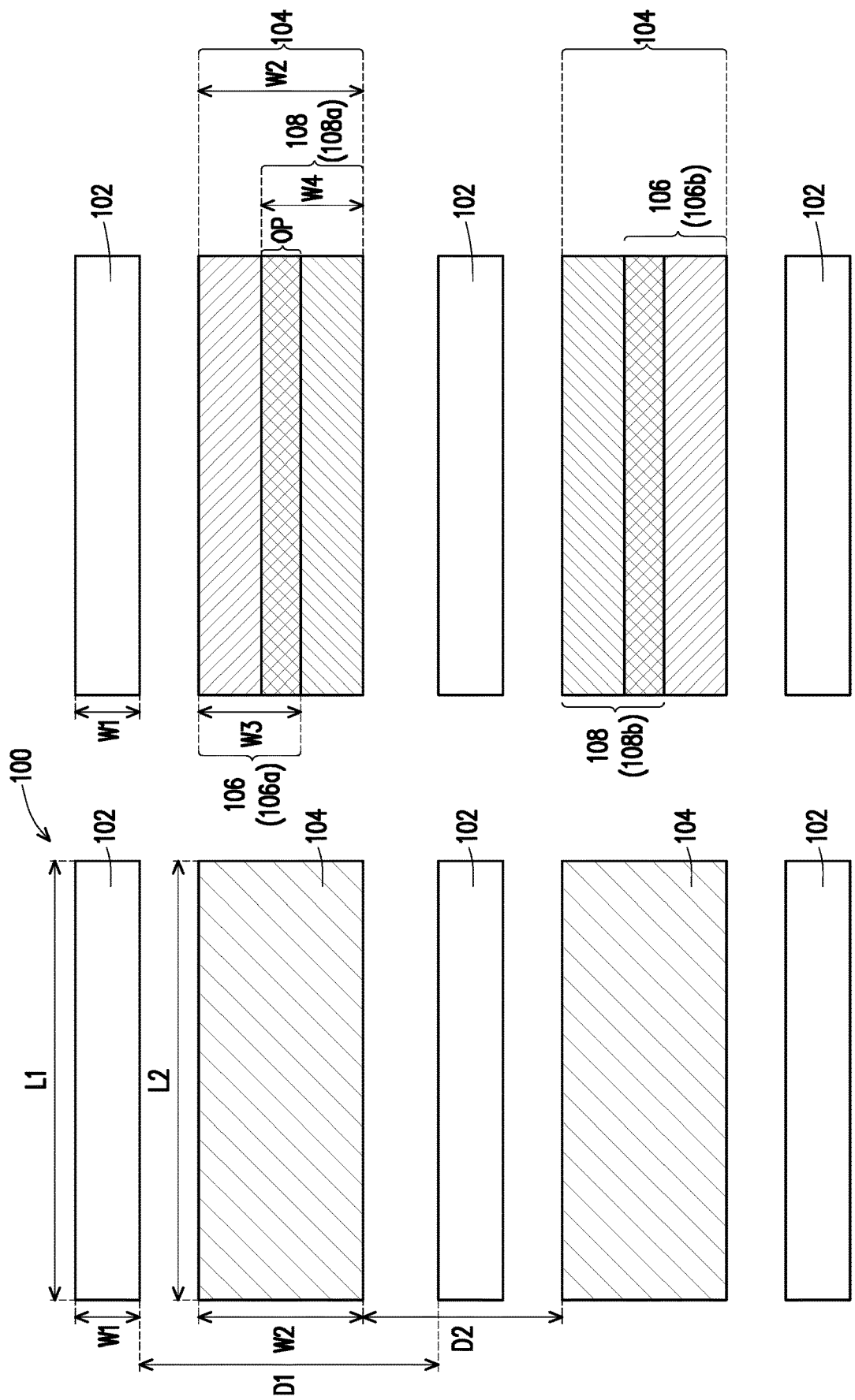

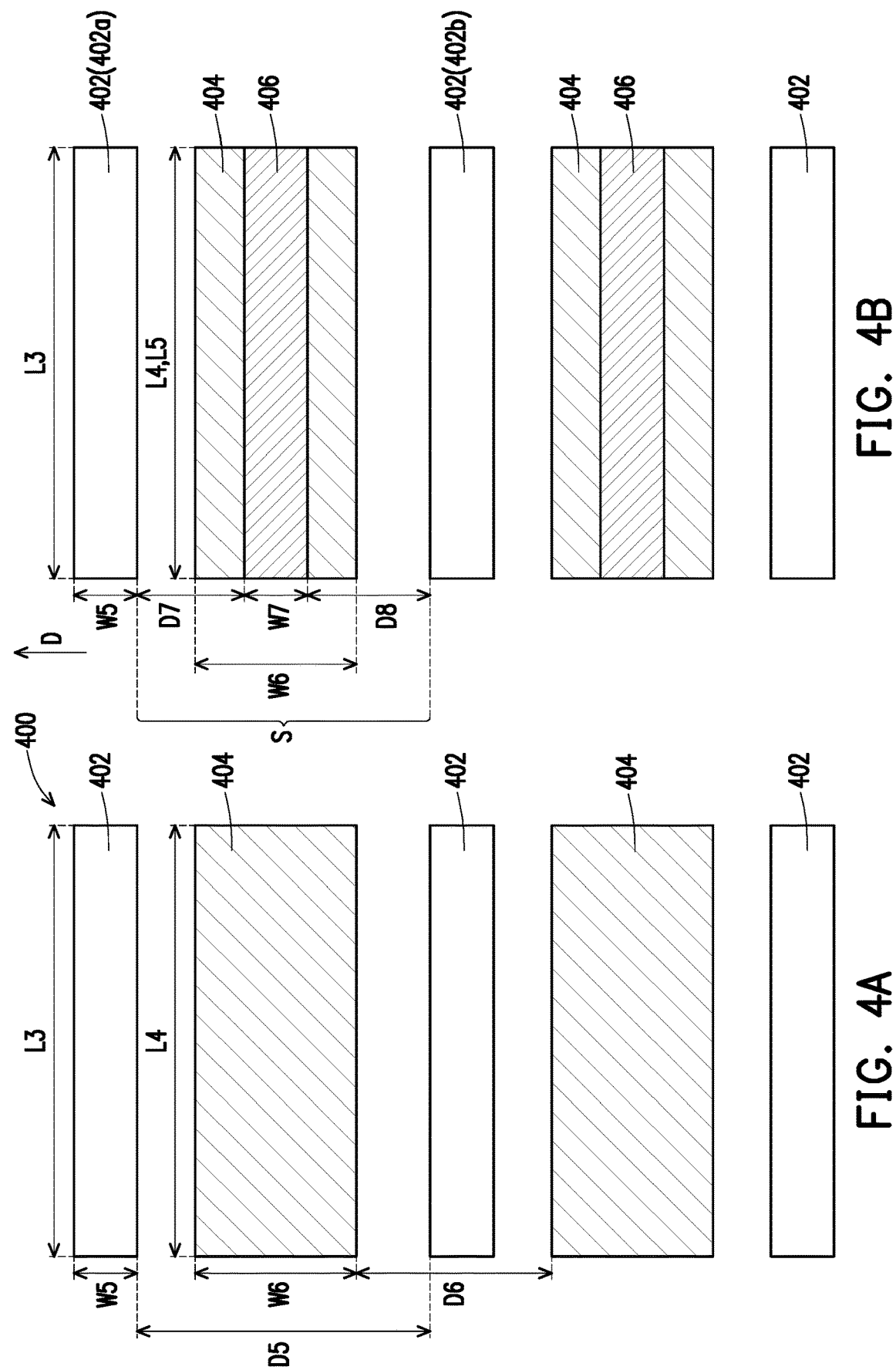

PATTERN DECOMPOSITION METHOD

CROSS-REFERENCE TO RELATED APPLICATION

This application claims the priority benefit of China application serial no. 202110600284.8, filed on May 31, 2021. The entirety of the above-mentioned patent application is hereby incorporated by reference herein and made a part of this specification.

BACKGROUND OF THE INVENTION

Field of the Invention

The invention relates to a semiconductor manufacturing process, and particularly relates to a pattern decomposition method.

Description of Related Art

Due to the limitation of the resolution of the lithography process, when the pattern spacing in the target pattern is too small, it is difficult to obtain the component (e.g., the conductive line) corresponding to the target pattern with a single photomask. Currently, a common practice is to decompose the pattern in the target pattern into two sets of patterns on two photomasks. In addition, after decomposing the pattern in the target pattern into the two sets of patterns on the two photomasks, the optical proximity correction (OPC) is performed on the two sets of patterns on the two photomasks respectively. However, after the OPC is performed on the two sets of patterns on the two photomasks, the exposure patterns obtained by performing the exposure using the above two photomasks often have problems such as pattern bridge, so that the component corresponding to the target pattern cannot be obtained successfully.

SUMMARY OF THE INVENTION

The invention provides a pattern decomposition method, which can help to successfully form the component corresponding to the target pattern.

The invention provides a pattern decomposition method, which includes the following steps. A target pattern is provided, wherein the target pattern includes first patterns and second patterns alternately arranged, and the width of the second pattern is greater than the width of the first pattern. Each of the second patterns is decomposed into a third pattern and a fourth pattern, wherein the third pattern and the fourth pattern have an overlapping portion, and a pattern formed by overlapping the third pattern and the fourth pattern is the same as the second pattern. The third patterns and the first pattern adjacent to the fourth pattern are designated as first photomask patterns of a first photomask. The fourth patterns and the first pattern adjacent to the third pattern are designated as second photomask patterns of a second photomask.

According to an embodiment of the invention, in the pattern decomposition method, the distance between two adjacent second patterns of the second patterns may be less than the distance between two adjacent first patterns of the first patterns.

According to an embodiment of the invention, in the pattern decomposition method, the distance between two adjacent first photomask patterns of the first photomask patterns may be less than the distance between two adjacent first patterns of the first patterns.

According to an embodiment of the invention, in the pattern decomposition method, the distance between two adjacent second photomask patterns of the second photomask patterns may be less than the distance between two adjacent first patterns of the first patterns.

According to an embodiment of the invention, in the pattern decomposition method, the width of the third pattern may be greater than the width of the first pattern.

According to an embodiment of the invention, in the pattern decomposition method, the width of the third pattern may be less than the width of the second pattern.

According to an embodiment of the invention, in the pattern decomposition method, the width of the fourth pattern may be greater than the width of the first pattern.

According to an embodiment of the invention, in the pattern decomposition method, the width of the fourth pattern may be less than the width of the second pattern.

According to an embodiment of the invention, in the pattern decomposition method, the fourth pattern in one of two adjacent second patterns of the second patterns may be located between the third pattern in one of the two adjacent second patterns and the fourth pattern in the other of the two adjacent second patterns. The fourth pattern in the other of the two adjacent second patterns may be located between the third pattern in the other of the two adjacent second patterns and the fourth pattern in one of the two adjacent second patterns.

According to an embodiment of the invention, in the pattern decomposition method, the third pattern and the fourth pattern in one of two adjacent second patterns of the second patterns may be respectively mirror-symmetrical to the third pattern and the fourth pattern in the other of the two adjacent second patterns with respect to the first pattern located between the two adjacent second patterns.

The invention provides another pattern decomposition method, which includes the following steps. A target pattern is provided, wherein the target pattern includes first patterns and second patterns alternately arranged, and the width of the second pattern is greater than the width of the first pattern. A third pattern is inserted into each of the second patterns, wherein the width of the third pattern is less than the width of the second pattern, and a pattern formed by overlapping the third pattern and the second pattern is the same as the second pattern. The first patterns and the third patterns are designated as first photomask patterns of a first photomask. The second patterns are designated as second photomask patterns of a second photomask.

According to another embodiment of the invention, in the pattern decomposition method, the distance between two adjacent second patterns of the second patterns may be less than the distance between two adjacent first patterns of the first patterns.

According to another embodiment of the invention, in the pattern decomposition method, the distance between two adjacent first photomask patterns of the first photomask patterns may be less than the distance between two adjacent first patterns of the first patterns.

According to another embodiment of the invention, in the pattern decomposition method, the distance between two adjacent second photomask patterns of the second photomask patterns may be less than the distance between two adjacent first patterns of the first patterns.

According to another embodiment of the invention, in the pattern decomposition method, the width of the third pattern may be the same as the width of the first pattern.

According to another embodiment of the invention, in the pattern decomposition method, the length of the third pattern may be the same as the length of the first pattern.

According to another embodiment of the invention, in the pattern decomposition method, the length of the third pattern may be the same as the length of the second pattern.

According to another embodiment of the invention, in the pattern decomposition method, the distance between the third pattern and the first pattern located on one side of the third pattern may be the same as the distance between the third pattern and the first pattern located on the other side of the third pattern.

According to another embodiment of the invention, in the pattern decomposition method, the third pattern may be located at the center of the space between two adjacent first patterns of the first patterns.

According to another embodiment of the invention, in the pattern decomposition method, the third pattern may be located at the center of the second pattern in the width direction of the second pattern.

Based on the above description, the pattern decomposition method according to the invention can increase the pattern density of the first photomask patterns of the first photomask. Thereby, when the optical proximity correction (OPC) is performed on the first photomask patterns of the first photomask, the first photomask patterns can be prevented from being excessively enlarged. Therefore, the pattern decomposition method of the invention can avoid problems such as pattern bridging between the exposure patterns obtained by performing the exposure using the first photomask and the second photomask. In addition, when the first photomask and the second photomask are used to form the component (e.g., the conductive line) corresponding to the target pattern, the pattern decomposition method of the invention helps to increase the process window, and further helps to successfully form the component corresponding to the target pattern.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2D are schematic views illustrating a pattern decomposition process according to an embodiment of the invention.

FIG. 4A to FIG. 4D are schematic views illustrating a pattern decomposition process according to another embodiment of the invention.

DESCRIPTION OF THE EMBODIMENTS

Figure 1:
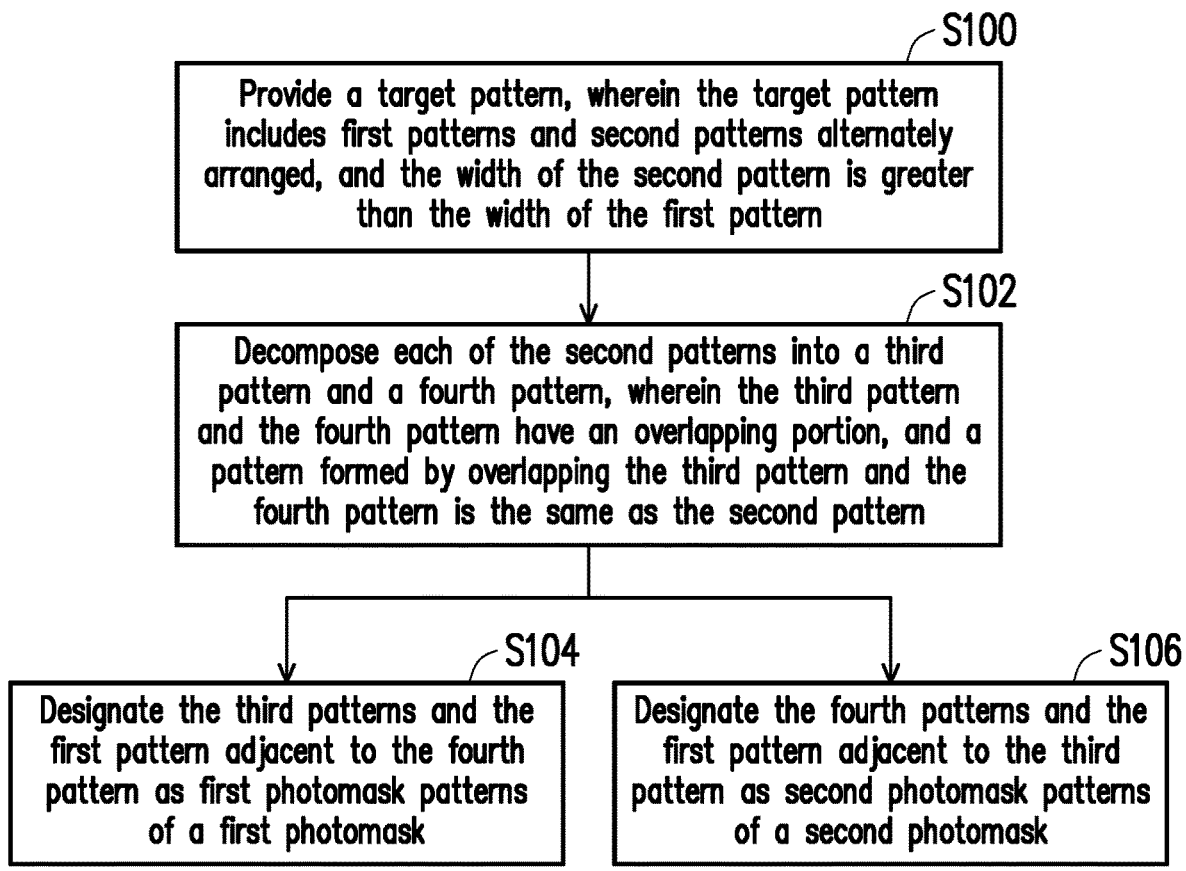
FIG. 1 is a flow chart illustrating a pattern decomposition method according to an embodiment of the invention.

FIG. 1 is a flow chart illustrating a pattern decomposition method according to an embodiment of the invention. FIG. 2A to FIG. 2D are schematic views illustrating a pattern decomposition process according to an embodiment of the invention.

Referring to FIG. 1 and FIG. 2A, a step S100 is performed, a target pattern 100 is provided, wherein the target pattern 100 includes first patterns 102 and second patterns 104 alternately arranged, and the width W2 of the second pattern 104 is greater than the width W1 of the first pattern 102. The target pattern 100 may be a pattern of a specific component. In some embodiments, the specific component may be a conductive line, but the invention is not limited thereto. In some embodiments, the "width" may be the "line width" of the specific component, such as the line width of the conductive line. In addition, the distance D2 between two adjacent second patterns 104 may be less than the distance D1 between two adjacent first patterns 102.

In some embodiments, the first patterns 102 may have the same width W1, but the invention is not limited thereto. In other embodiments, the first patterns 102 may have different widths W1. In some embodiments, the second patterns 104 may have the same width W2, but the invention is not limited thereto. In other embodiments, the second patterns 104 may have different widths W2. In some embodiments, the first patterns 102 may have the same length L1, but the invention is not limited thereto. In other embodiments, the first patterns 102 may have different lengths L1. In some embodiments, the second patterns 104 may have the same length L2, but the invention is not limited thereto. In other embodiments, the second patterns 104 may have different lengths L2. Furthermore, the length L1 of the first pattern 102 and the length L2 of the second pattern 104 may be the same or different.

Referring to FIG. 1 and FIG. 2B, a step S102 is performed, each of the second patterns 104 is decomposed into a third pattern 106 and a fourth pattern 108, wherein the third pattern 106 and the fourth pattern 108 have an overlapping portion OP, and a pattern formed by overlapping the third pattern 106 and the fourth pattern 108 is the same as the second pattern 104. In some embodiments, the width W3 of the third pattern 106 may be greater than the width W1 of the first pattern 102. In other embodiments, the width W3 of the third pattern 106 may be less than or equal to the width W1 of the first pattern 102. The width W3 of the third pattern 106 may be less than the width W2 of the second pattern 104. In some embodiments, the width W4 of the fourth pattern 108 may be greater than the width W1 of the first pattern 102. In other embodiments, the width W4 of the fourth pattern 108 may be less than or equal to the width W1 of the first pattern 102. The width W4 of the fourth pattern 108 may be less than the width W2 of the second pattern 104. As long as the pattern formed by overlapping the third pattern 106 and the fourth pattern 108 is the same as the second pattern 104, the width W3 of the third pattern 106 and the width W4 of the fourth pattern 108 may be adjusted according to requirements.

Moreover, the fourth pattern 108 (e.g., the fourth pattern 108a) in one of two adjacent second patterns 104 may be located between the third pattern 106 (e.g., the third pattern 106a) in one of the two adjacent second patterns 104 and the fourth pattern 108 (e.g., the fourth pattern 108b) in the other of the two adjacent second patterns 104. In addition, the fourth pattern 108 (e.g., the fourth pattern 108b) in the other of the two adjacent second patterns 104 may be located between the third pattern 106 (e.g., the third pattern 106b) in the other of the two adjacent second patterns 104 and the fourth pattern 108 (e.g., the fourth pattern 108a) in one of the two adjacent second patterns 104.

In some embodiments, the third pattern 106 and the fourth pattern 108 (e.g., the third pattern 106a and the fourth pattern 108a) in one of two adjacent second patterns 104 may be respectively mirror-symmetrical to the third pattern 106 and the fourth pattern 108 (e.g., the third pattern 106b and the fourth pattern 108b) in the other of the two adjacent second patterns 104 with respect to the first pattern 102 located between the two adjacent second patterns 104, but the invention is not limited thereto. In other embodiments, the third pattern 106 and the fourth pattern 108 (e.g., the third pattern 106a and the fourth pattern 108a) in one of two adjacent second patterns 104 may not be respectively mirror-symmetrical to the third pattern 106 and the fourth pattern 108 (e.g., the third pattern 106b and the fourth pattern 108b) in the other of the two adjacent second patterns 104 with respect to the first pattern 102 located between the two adjacent second patterns 104.

Figure 2D:
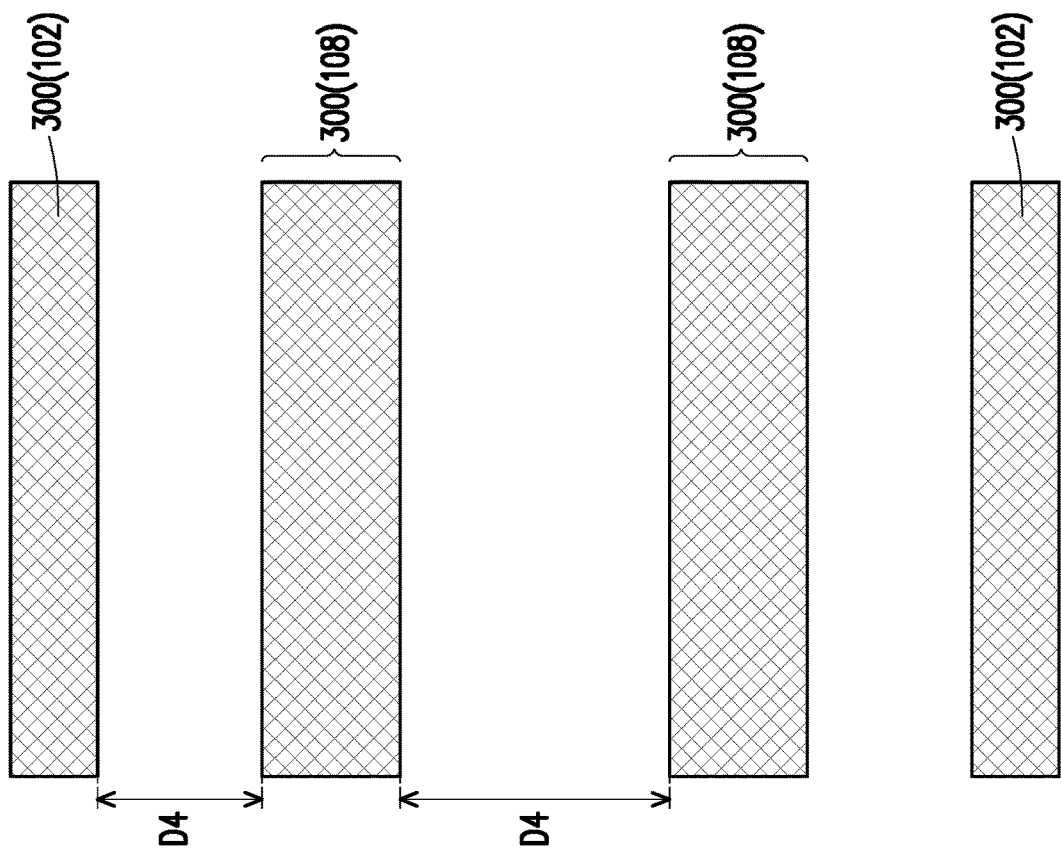
Figure 2C:
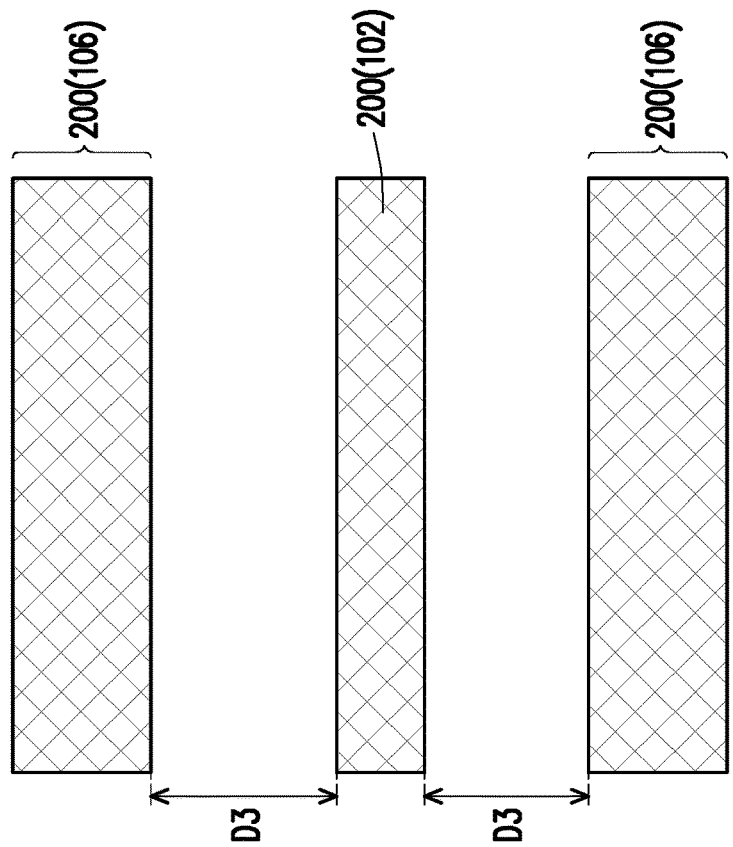

Referring to FIG. 1 and FIG. 2C, a step S104 is performed, the third patterns 106 and the first pattern 102 adjacent to the fourth pattern 108 are designated as first photomask patterns 200 of a first photomask. The distance D3 between two adjacent first photomask patterns 200 (FIG. 2C) may be less than the distance D1 between two adjacent first patterns 102 (FIG. 2A).

Referring to FIG. 1 and FIG. 2D, a step S106 is performed, the fourth patterns 108 and the first pattern 102 adjacent to the third pattern 106 are designated as second photomask patterns 300 of a second photomask. The distance D4 between two adjacent second photomask patterns 300 (FIG. 2D) may be less than the distance D1 between two adjacent first patterns 102 (FIG. 2A).

Based on the above embodiment, in the pattern decomposition method, each of the second patterns 104 is decomposed into the third pattern 106 and the fourth pattern 108, wherein the third pattern 106 and the fourth pattern 108 have the overlapping portion OP, and the pattern formed by overlapping the third pattern 106 and the fourth pattern 108 is the same as the second pattern 104. In addition, the third patterns 106 and the first pattern 102 adjacent to the fourth pattern 108 are designated as the first photomask patterns 200 of the first photomask, and the fourth patterns 108 and the first pattern 102 adjacent to the third pattern 106 are designated as the second photomask patterns 300 of the second photomask. Thereby, the pattern density of the first photomask patterns 200 of the first photomask can be increased. In this way, when the optical proximity correction (OPC) is performed on the first photomask pattern 200 of the first photomask, the first photomask pattern 200 can be prevented from being excessively enlarged. Therefore, problems such as pattern bridging between the exposure patterns obtained by performing the exposure using the first photomask and the second photomask can be avoided. Furthermore, when the first photomask and the second photomask are used to form the component (e.g., the conductive line) corresponding to the target pattern 100, the pattern decomposition method of the above embodiment helps to increase the process window, and further helps to successfully form the component corresponding to the target pattern 100.

Figure 3:
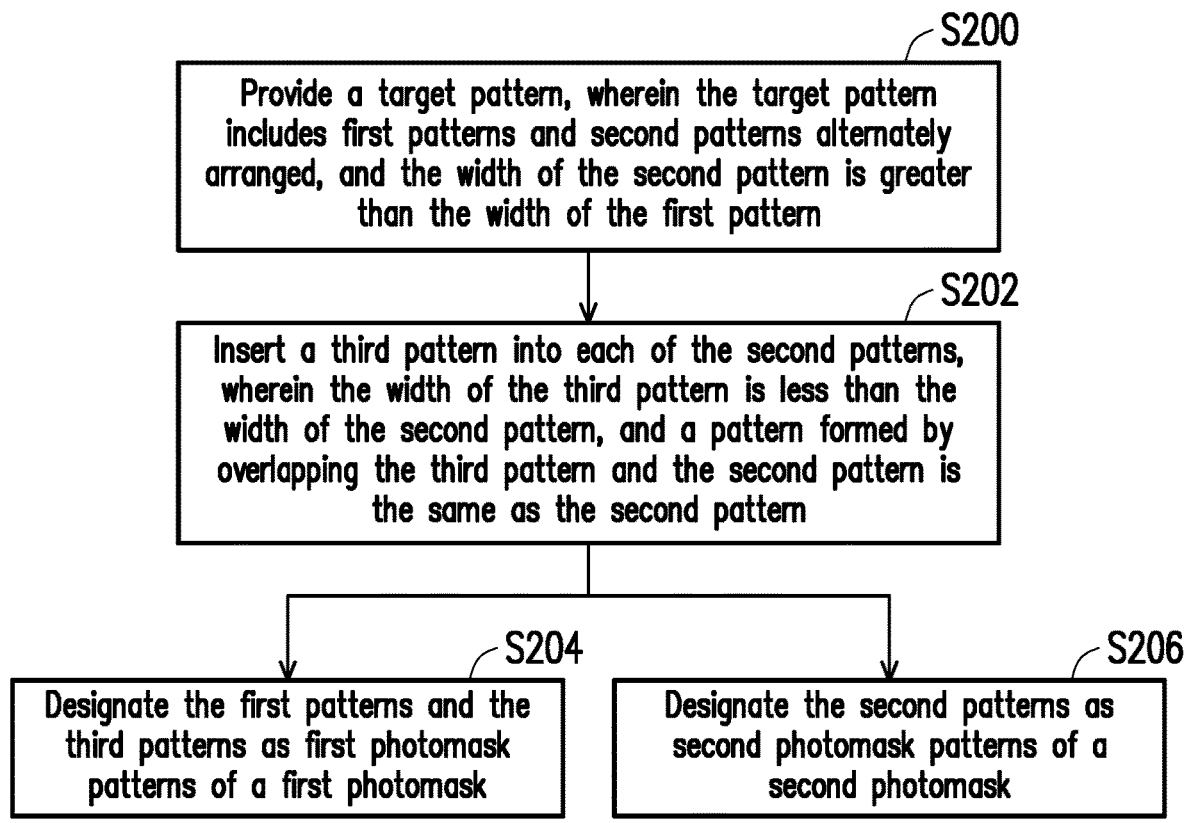
FIG. 3 is a flow chart illustrating a pattern decomposition method according to another embodiment of the invention.

FIG. 3 is a flow chart illustrating a pattern decomposition method according to another embodiment of the invention. FIG. 4A to FIG. 4D are schematic views illustrating a pattern decomposition process according to another embodiment of the invention.

Referring to FIG. 3 and FIG. 4A, a step S200 is performed, a target pattern 400 is provided, wherein the target pattern 400 includes first patterns 402 and second patterns 404 alternately arranged, and the width W6 of the second pattern 404 is greater than the width W5 of the first pattern 402. The target pattern 400 may be a pattern of a specific component. In some embodiments, the specific component may be a conductive line, but the invention is not limited thereto. In some embodiments, the "width" may be the "line width" of the specific component, such as the line width of the conductive line. In addition, the distance D6 between two adjacent second patterns 404 may be less than the distance D5 between two adjacent first patterns 402.

In some embodiments, the first patterns 402 may have the same width W5, but the invention is not limited thereto. In other embodiments, the first patterns 402 may have different widths W5. In some embodiments, the second patterns 404 may have the same width W6, but the invention is not limited thereto. In other embodiments, the second patterns 404 may have different widths W6. In some embodiments, the first patterns 402 may have the same length L3, but the invention is not limited thereto. In other embodiments, the first patterns 402 may have different lengths L3. In some embodiments, the second patterns 404 may have the same length L4, but the invention is not limited thereto. In other embodiments, the second patterns 404 may have different lengths L4. Furthermore, the length L3 of the first pattern 402 and the length L4 of the second pattern 404 may be the same or different.

Referring to FIG. 3 and FIG. 4B, a step S202 is performed, a third pattern 406 is inserted into each of the second patterns 404, wherein the width W7 of the third pattern 406 is less than the width W6 of the second pattern 404, and a pattern formed by overlapping the third pattern 406 and the second pattern 404 is the same as the second pattern 404. In some embodiments, the third patterns 406 may have the same width W7, but the invention is not limited thereto. In other embodiments, the third patterns 406 may have different widths W7. In some embodiments, the third patterns 406 may have the same length L5, but the invention is not limited thereto. In other embodiments, the third pattern 406 may have different lengths L5. In some embodiments, the length L5 of the third pattern 406 may be the same as the length L4 of the second pattern 404, but the invention is not limited thereto. In other embodiments, the length L5 of the third pattern 406 may be less than the length L4 of the second pattern 404.

In some embodiments, the width W7 of the third pattern 406 may be the same as the width W5 of the first pattern 402, but the invention is not limited thereto. In other embodiments, the width W7 of the third pattern 406 may be different from the width W5 of the first pattern 402. In some embodiments, the length L5 of the third pattern 406 may be the same as the length L3 of the first pattern 402, but the invention is not limited thereto. In other embodiments, the length L5 of the third pattern 406 may be different from the length L3 of the first pattern 402. In some embodiments, the third pattern 406 and the first pattern 402 may have the same shape. In other embodiments, the third pattern 406 and the first pattern 402 may have different shapes.

In some embodiments, the distance D7 between the third pattern 406 and the first pattern 402 (e.g., the first pattern 402a) located on one side of the third pattern 406 may be the same as the distance D8 between the third pattern 406 and the first pattern 402 (e.g., first pattern 402b) located on the other side of the third pattern 406. In other embodiments, the distance D7 between the third pattern 406 and the first pattern 402 (e.g., the first pattern 402a) located on one side of the third pattern 406 may be different from the distance D8 between the third pattern 406 and the first pattern 402 (e.g., first pattern 402b) located on the other side of the third pattern 406.

In some embodiments, the third pattern 406 may be located at the center of the space S between two adjacent first patterns 402. In other embodiments, the third pattern 406 may not be located at the center of the space S between two adjacent first patterns 402.

In some embodiments, the third pattern 406 may be located at the center of the second pattern 404 in the width direction D of the second pattern 404. In other embodiments, the third pattern 406 may not be located at the center of the second pattern 404 in the width direction D of the second pattern 404.

Figure 4D:
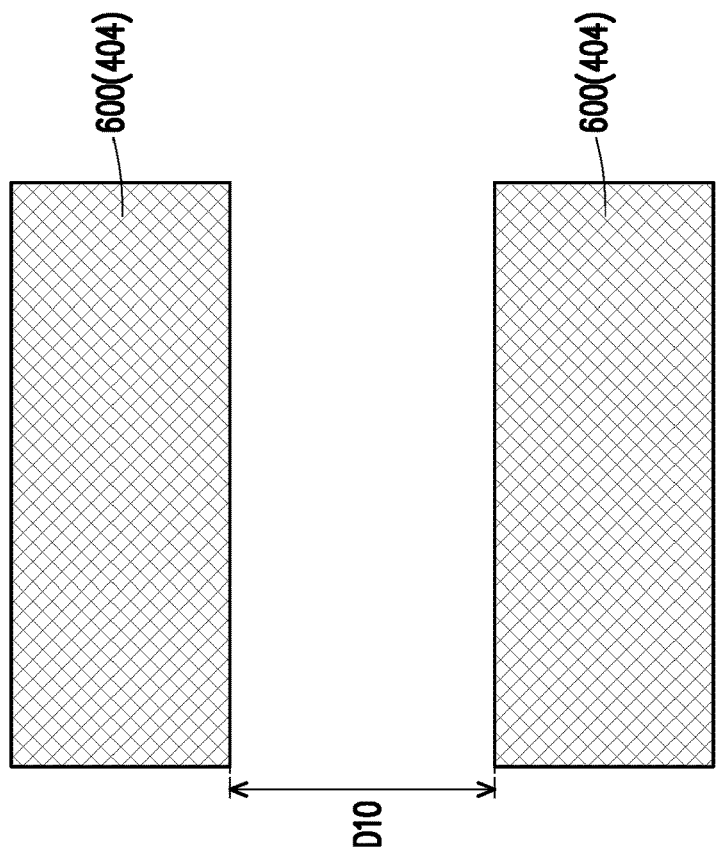
Figure 4C:
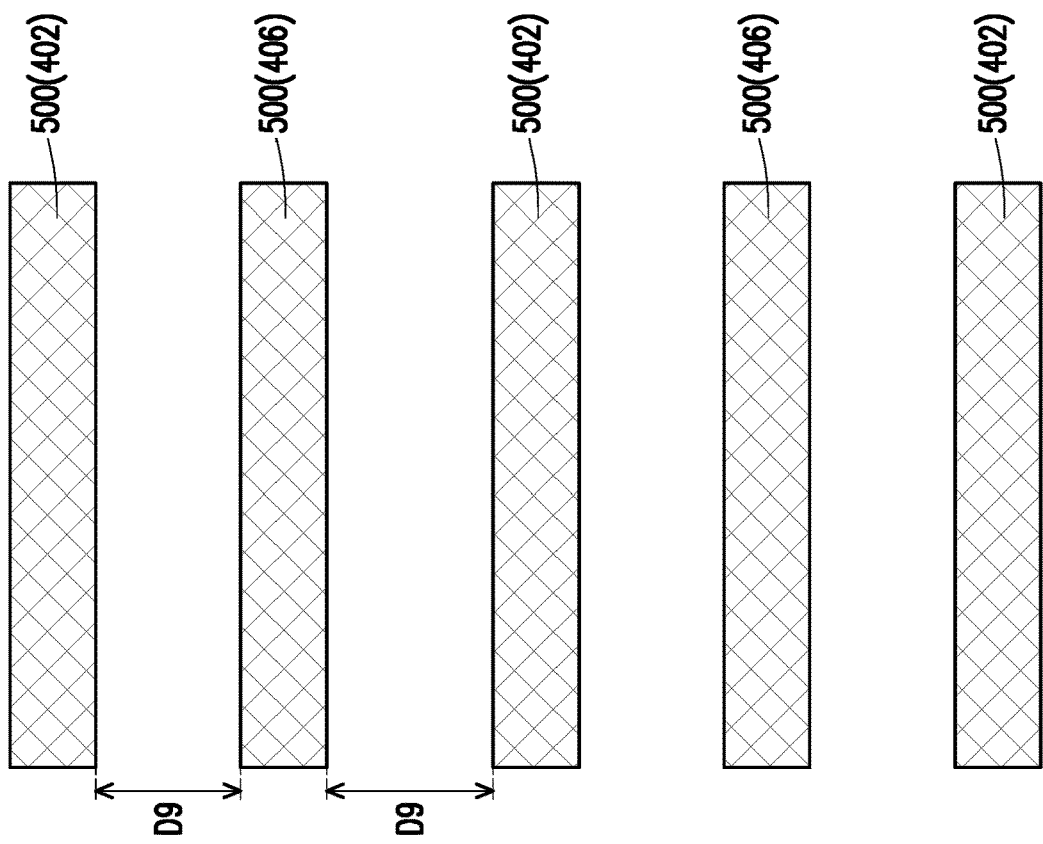

Referring to FIG. 3 and FIG. 4C, a step S204 is performed, the first patterns 402 and the third patterns 406 are designated as first photomask patterns 500 of a first photomask. The distance D9 between two adjacent first photomask patterns 500 (FIG. 4C) may be less than the distance D5 between two adjacent first patterns 402 (FIG. 4A).

Referring to FIG. 3 and FIG. 4D, a step S206 is performed, the second patterns 404 are designated as second photomask patterns 600 of a second photomask. The distance D10 between two adjacent second photomask patterns 600 (FIG. 4D) may be less than the distance D5 between two adjacent first patterns 402 (FIG. 4A).

Based on the above embodiment, in the pattern decomposition method, the third pattern 406 is inserted into each of the second patterns 404, wherein the width W7 of the third pattern 406 is less than the width W6 of the second pattern 404, and the pattern formed by overlapping the third pattern 406 and the second pattern 404 is the same as the second pattern 404. In addition, the first patterns 402 and the third patterns 406 are designated as the first photomask patterns 500 of the first photomask, and the second patterns 404 are designated as the second photomask patterns 600 of the second photomask. Thereby, the pattern density of the first photomask patterns 500 of the first photomask can be increased. In this way, when the optical proximity correction (OPC) is performed on the first photomask pattern 500 of the first photomask, the first photomask pattern 500 can be prevented from being excessively enlarged. Therefore, problems such as pattern bridging between the exposure patterns obtained by performing the exposure using the first photomask and the second photomask can be avoided. Furthermore, when the first photomask and the second photomask are used to form the component (e.g., the conductive line) corresponding to the target pattern 400, the pattern decomposition method of the above embodiment helps to increase the process window, and further helps to successfully form the component corresponding to the target pattern 400.

In summary, the pattern decomposition method of the aforementioned embodiments can increase the pattern density of the first photomask patterns of the first photomask. Thereby, when the optical proximity correction (OPC) is performed on the first photomask patterns of the first photomask, the first photomask patterns can be prevented from being excessively enlarged. Therefore, when the first photomask and the second photomask are used to form the component corresponding to the target pattern, the pattern decomposition method of the aforementioned embodiments helps successfully form the component corresponding to the target pattern.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A pattern decomposition method, comprising:
providing a target pattern, wherein the target pattern comprises first patterns and second patterns alternately arranged, and a width of the second pattern is greater than a width of the first pattern;
decomposing each of the second patterns into a third pattern and a fourth pattern, wherein the third pattern and the fourth pattern have an overlapping portion, and a pattern formed by overlapping the third pattern and the fourth pattern is the same as the second pattern;
designating the third patterns and the first pattern adjacent to the fourth pattern as first photomask patterns; and
designating the fourth patterns and the first pattern adjacent to the third pattern as second photomask patterns,
wherein a distance between two adjacent second patterns is less than a distance between two adjacent first patterns,
wherein a width of the third pattern is less than the width of the second pattern,
wherein a width of the fourth pattern is less than the width of the second pattern.

2. The pattern decomposition method according to claim 1, wherein a distance between two adjacent first photomask patterns is less than a distance between two adjacent first patterns.

3. The pattern decomposition method according to claim 1, wherein a distance between two adjacent second photomask patterns is less than a distance between two adjacent first patterns.

4. The pattern decomposition method according to claim 1, wherein the width of the third pattern is greater than the width of the first pattern.

5. The pattern decomposition method according to claim 1, wherein the width of the fourth pattern is greater than the width of the first pattern.

6. The pattern decomposition method according to claim 1, wherein
the fourth pattern in one of two adjacent second patterns is located between the third pattern in one of the two adjacent second patterns and the fourth pattern in the other of the two adjacent second patterns, and
the fourth pattern in the other of the two adjacent second patterns is located between the third pattern in the other of the two adjacent second patterns and the fourth pattern in one of the two adjacent second patterns.

7. The pattern decomposition method according to claim 1, wherein the third pattern in one of two adjacent second patterns is mirror-symmetrical to the third pattern in the other of the two adjacent second patterns with respect to of the first pattern located between the two adjacent second patterns, and
wherein the fourth pattern in one of the two adjacent second patterns is mirror-symmetrical to the fourth pattern in the other of the two adjacent second patterns with respect to the first pattern located between the two adjacent second patterns.

* * * * *